(12) United States Patent
Higuchi

(10) Patent No.: US 11,189,534 B2
(45) Date of Patent: Nov. 30, 2021

(54) SEMICONDUCTOR ASSEMBLY AND DETERIORATION DETECTION METHOD

(71) Applicant: FUJI ELECTRIC CO., LTD., Kanagawa (JP)

(72) Inventor: Keiichi Higuchi, Matsumoto (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 0 days.

(21) Appl. No.: 16/752,685

(22) Filed: Jan. 26, 2020

(65) Prior Publication Data
US 2020/0303267 A1    Sep. 24, 2020

(30) Foreign Application Priority Data
Mar. 18, 2019    (JP) ............................. JP2019-049921

(51) Int. Cl.
*H01L 21/66* (2006.01)
*H01L 23/492* (2006.01)
*H01L 23/00* (2006.01)

(52) U.S. Cl.
CPC ............ *H01L 22/30* (2013.01); *H01L 23/492* (2013.01); *H01L 24/48* (2013.01); *H01L 2224/48245* (2013.01)

(58) Field of Classification Search
CPC ....... H01L 22/30; H01L 23/492; H01L 24/48; H01L 2224/48245
See application file for complete search history.

(56) References Cited

U.S. PATENT DOCUMENTS

| | | | |
|---|---|---|---|
| 5,642,252 | A | 6/1997 | Sakamoto |
| 10,396,065 | B2 | 8/2019 | Nishimura |
| 2007/0114577 | A1 | 5/2007 | Narazaki |
| 2012/0153349 | A1 | 6/2012 | Suzuki |
| 2019/0301946 | A1* | 10/2019 | Sato ................ H01L 29/0834 |

FOREIGN PATENT DOCUMENTS

| | | |
|---|---|---|
| JP | H0758293 A | 3/1995 |
| JP | 2006210519 A | 8/2006 |
| JP | 2006303290 A | 11/2006 |
| JP | 2007142138 A | 6/2007 |
| JP | 2012134198 A | 7/2012 |
| JP | 2017022310 A | 1/2017 |
| WO | 2014024595 A1 | 2/2014 |

* cited by examiner

*Primary Examiner* — Peniel M Gumedzoe

(57) ABSTRACT

A semiconductor assembly is provided, that includes a semiconductor chip including an upper surface electrode and a lower surface electrode opposite to the upper surface electrode, a metallic wiring plate electrically connected to the semiconductor chip, and a soldering portion that bonds the upper surface electrode of the semiconductor chip to the metallic wiring plate by soldering, the semiconductor chip including a temperature detection portion, an anode wire for the temperature detection portion, and a first insulation layer that blocks the soldering portion and insulates the soldering portion from the anode wire. A deterioration detection method for a semiconductor module is provided, that includes a semiconductor assembly, the deterioration detection method including monitoring a temperature of a temperature detection portion disposed in a semiconductor chip, and detecting a temperature anomaly based on short circuit of an anode wire disposed in the semiconductor chip to detect deterioration of the semiconductor module.

21 Claims, 15 Drawing Sheets

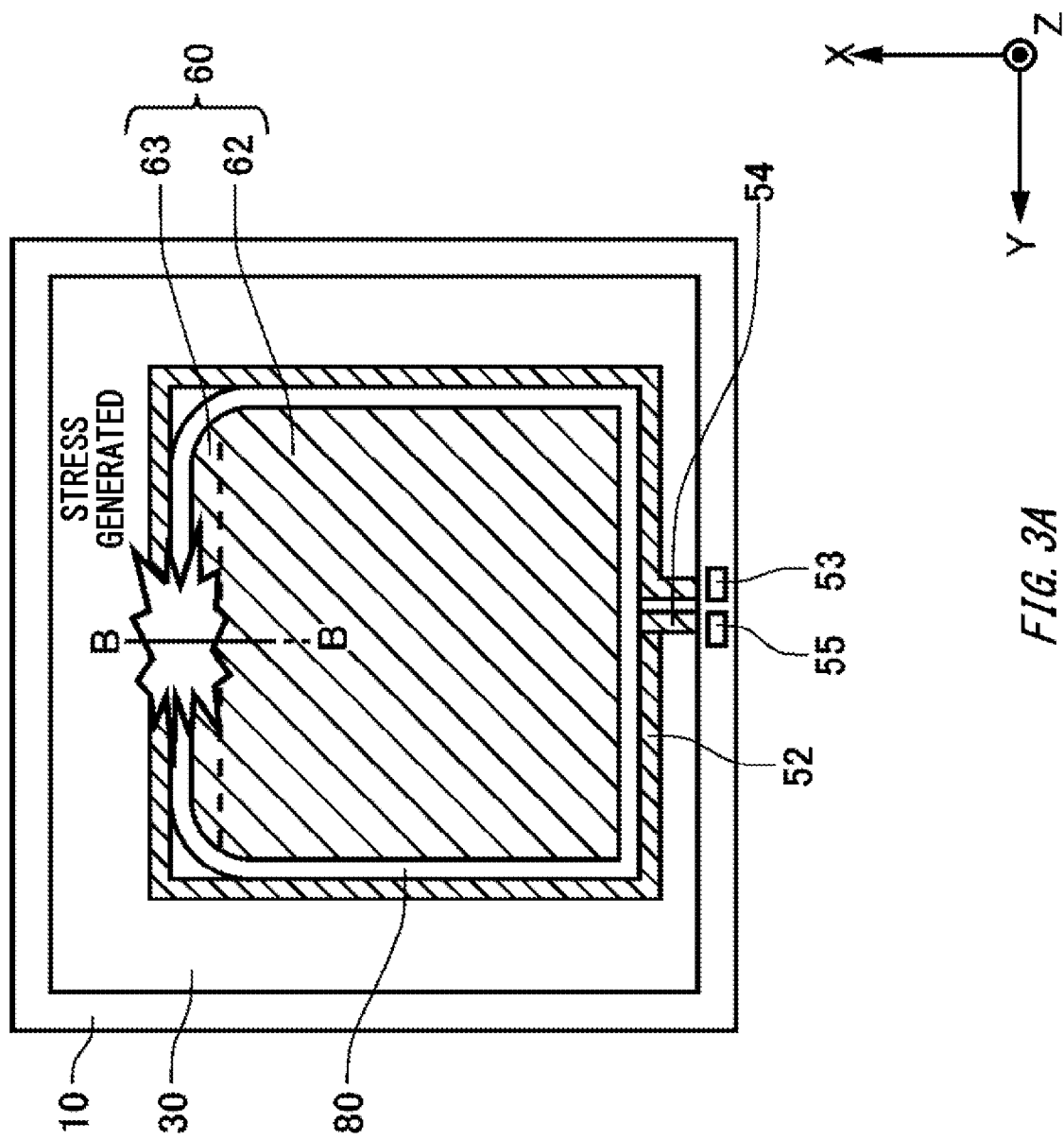

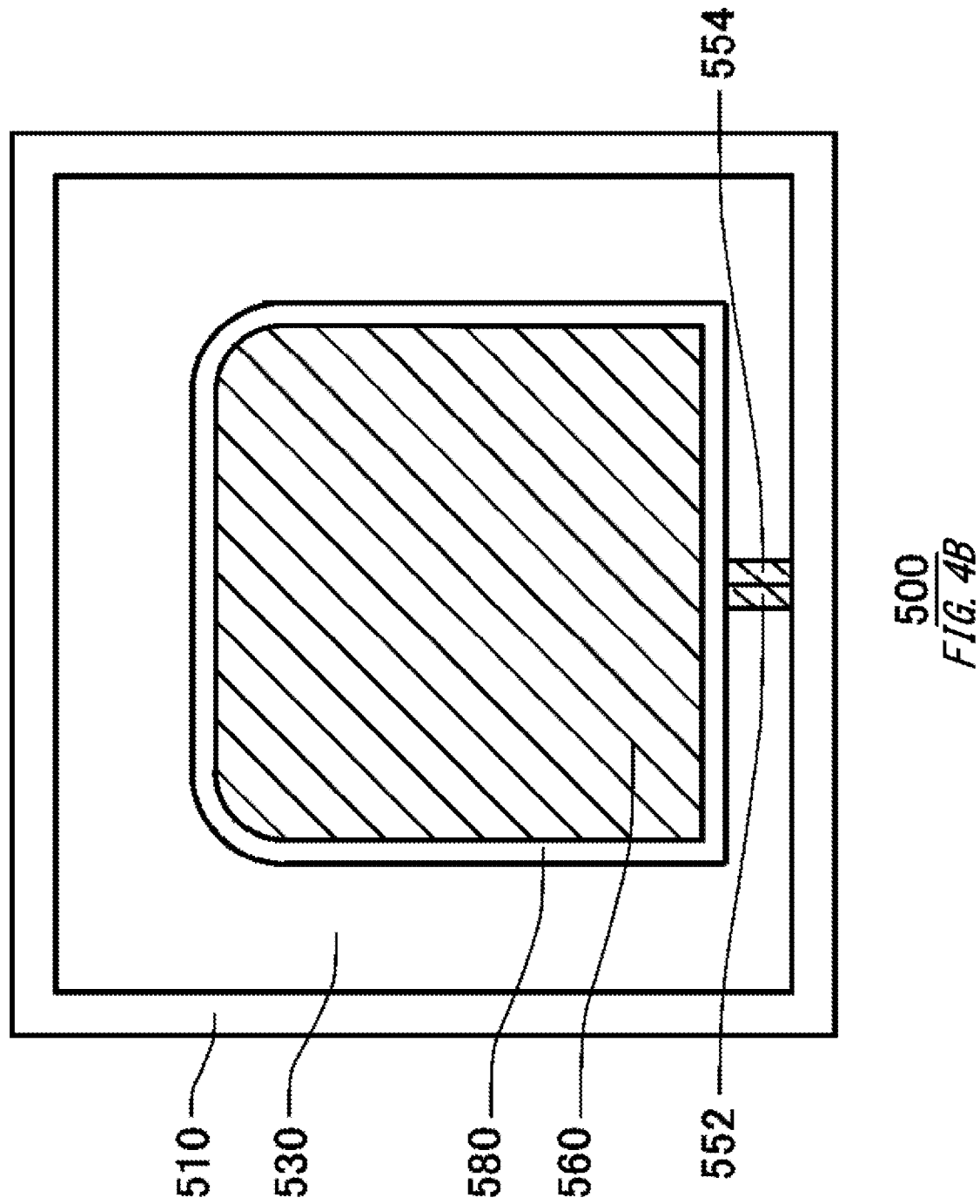

SEMICONDUCTOR ASSEMBLY AND DETERIORATION DETECTION METHOD

The contents of the following Japanese patent application are incorporated herein by reference:
NO. 2019-049921 filed in JP on Mar. 18, 2019

BACKGROUND

1. Technical Field

The present invention relates to a semiconductor assembly and a deterioration detection method.

2. Related Art

Up to now, a semiconductor apparatus including a built-in ultrasound generator has been proposed which detects a deterioration state of a device using ultrasound (for example, Patent Document 1).

Patent Document 1 Japanese Unexamined Patent Application Publication No. 2017-22310

However, according to a related-art method, the ultrasound generator configured to detect the deterioration state is to be added to the semiconductor apparatus.

SUMMARY

According to a first aspect of the present invention, there is provided a semiconductor assembly that includes a semiconductor chip including an upper surface electrode and a lower surface electrode opposite to the upper surface electrode, a metallic wiring plate electrically connected to the semiconductor chip, and a soldering portion that bonds the upper surface electrode of the semiconductor chip to the metallic wiring plate by soldering, the semiconductor chip including a temperature detection portion, an anode wire for the temperature detection portion, and a first insulation layer that blocks the soldering portion and insulates the soldering portion from the anode wire.

The semiconductor chip may further include a semiconductor substrate, and a second insulation layer that is disposed on an upper surface of the semiconductor substrate and provides insulation between the anode wire and the semiconductor substrate, and the upper surface electrode may be disposed on an upper surface of the second insulation layer.

An upper surface of the anode wire and the upper surface of the second insulation layer may be provided on a same plane as an upper surface of the upper surface electrode. The first insulation layer may be disposed on the same plane of the anode wire, the second insulation layer, and the upper surface electrode.

The anode wire may be disposed in a manner that an upper surface and side surfaces of the anode wire are covered with the first insulation layer on the upper surface of the second insulation layer. An upper surface of the first insulation layer may be provided above the upper surface of the upper surface electrode.

The upper surface of the anode wire may be provided on a same plane as the upper surface of the upper surface electrode.

The upper surface of the anode wire may be provided below the upper surface of the upper surface electrode.

The anode wire may be disposed in a manner that a surrounding of the anode wire is covered with the second insulation layer below a boundary between the first insulation layer and the upper surface electrode.

A distance between the anode wire and the soldering portion may be shorter than a distance between the semiconductor substrate and the soldering portion.

The anode wire may be disposed to surround an external periphery of the metallic wiring plate.

The metallic wiring plate may include a bonding portion that provides bonding to the semiconductor chip, and a raised portion that is connected to the bonding portion and extends in a direction away from the semiconductor chip. The raised portion may be disposed to be closer to a region for blocking the soldering portion of the first insulation layer than the bonding portion.

According to a second aspect of the present invention, there is provided a semiconductor module including the semiconductor assembly according to the first aspect of the present invention.

According to a third aspect of the present invention, there is provided a deterioration detection method for a semiconductor module that includes a semiconductor assembly, the deterioration detection method including monitoring a temperature of a temperature detection portion disposed in a semiconductor chip, and detecting a temperature anomaly based on short circuit of an anode wire disposed in the semiconductor chip to detect deterioration of the semiconductor module.

The summary clause does not necessarily describe all necessary features of the embodiments of the present invention. The present invention may also be a sub-combination of the features described above.

BRIEF DESCRIPTION OF THE DRAWINGS

FIG. 3A illustrates a top view of the semiconductor chip 10 at the time of occurrence of a temperature anomaly.

FIG. 4B is an example of the semiconductor assembly 500 according to the comparative example.

DESCRIPTION OF EXEMPLARY EMBODIMENTS

Hereinafter, the present invention will be described by way of embodiments, but the following embodiments are not intended to limit the invention described in the scope of the invention. In addition, not all combinations of features described in the embodiments necessarily have to be essential to solving means of the invention.

Figure 1A:
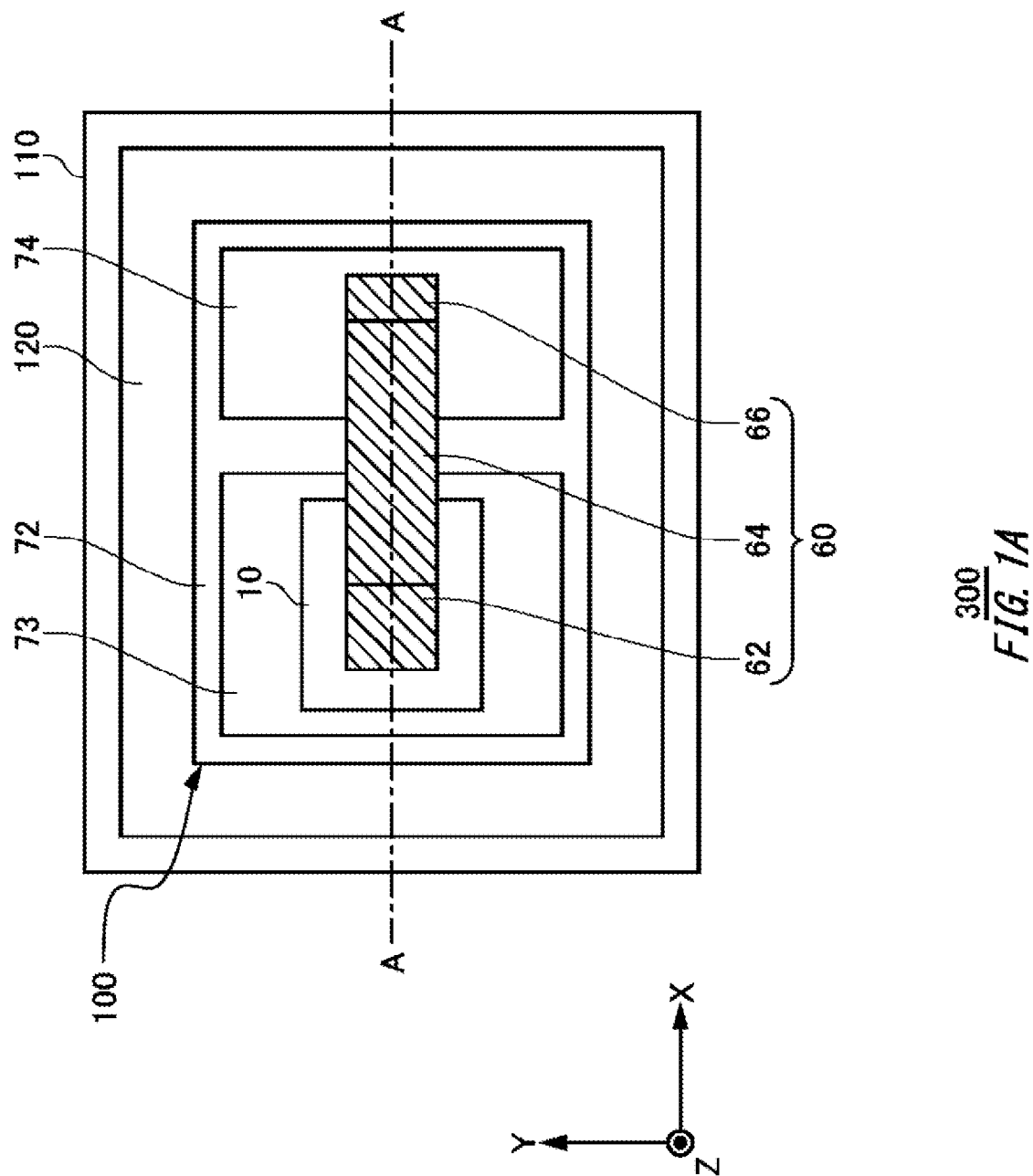
FIG. 1A is a top view of a semiconductor module 300 according to a first embodiment.
Figure 1B:
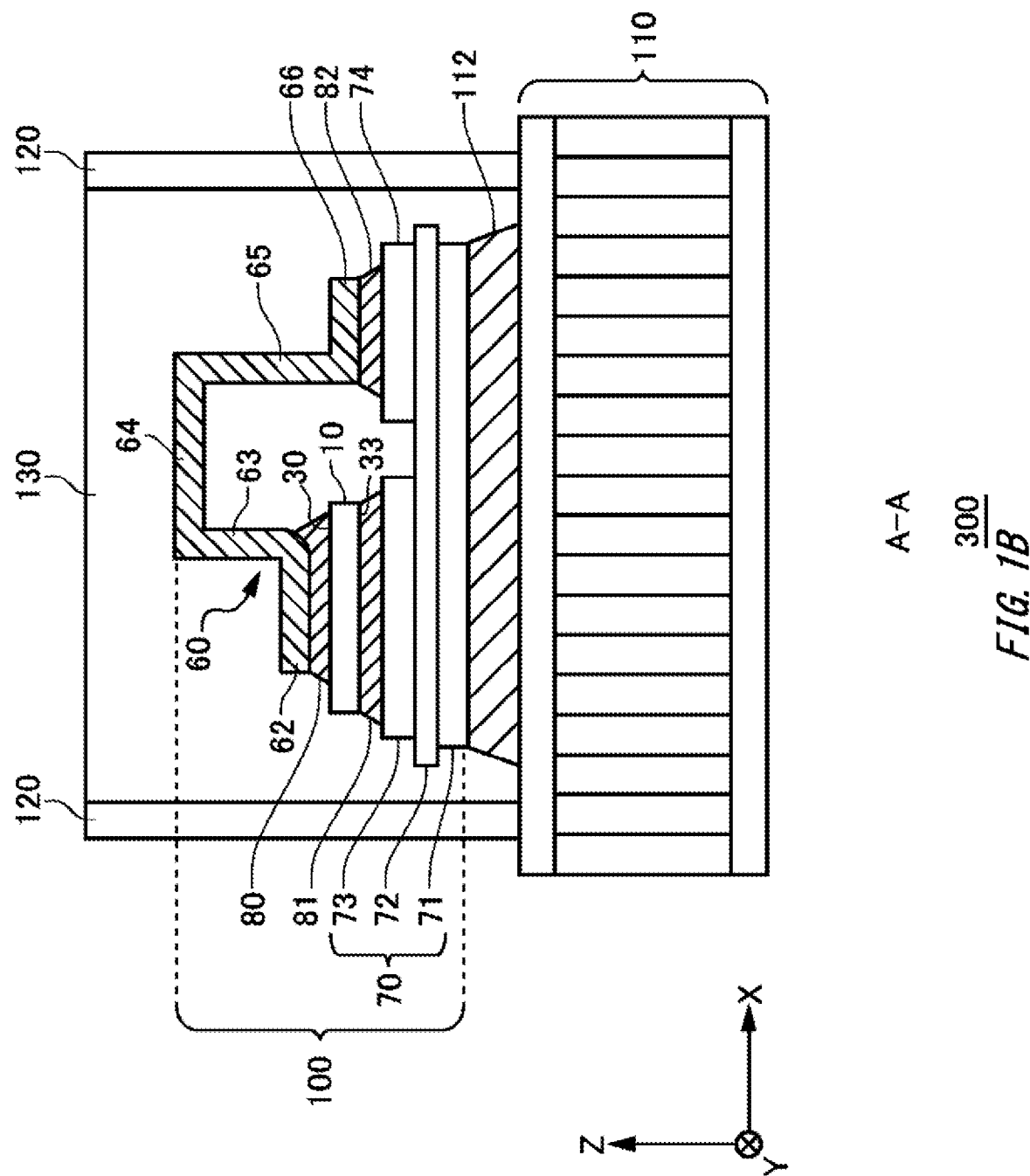
FIG. 1B is a cross sectional view along A-A in FIG. 1A.

FIG. 1A is a top view of a semiconductor module 300. FIG. 1B is a cross sectional view along A-A in FIG. 1A. The semiconductor module 300 in this example includes a semiconductor assembly 100, a cooling portion 110, a case 120, and sealing resin 130.

According to the present specification, one side in a thickness direction of the semiconductor assembly 100 is referred to as "upper", and the other side is referred to as "lower". One surface of two main surfaces of a device, a substrate, a layer, a film, or other components is referred to as an upper surface, and the other surface is referred to as a lower surface. The "upper" and "lower" directions are not limited to gravity directions. In this example, the upper and lower directions are referred to as a Z-axis direction, and two orthogonal directions in a plane perpendicular to the Z-axis direction are referred to as an X-axis direction and a Y-axis direction. The XYZ axes constitute a right-handed system. A top view corresponds to a case where the semiconductor assembly 100 is viewed from a Z-axis positive direction.

According to the respective embodiments, an example is illustrated where a first conductivity type is set as an N type, and a second conductivity type is set as a P type, but the first conductivity type may also be set as the P type, and the second conductivity type may also be set as the N type. In this case, conductivity types of a substrate, a layer, a region, and the like according to the respective embodiments are respectively set as opposite polarities. A layer and a region prefixed with N or P respectively mean that electrons or holes are majority carriers. In addition, + and − signs added to N and P respectively mean a higher doping concentration and a lower doping concentration than a doping concentration of a layer or a region without the signs.

The semiconductor assembly 100 is bonded onto the cooling portion 110 by soldering using a soldering portion 112. The semiconductor assembly 100 may also be placed on a metallic base plate. The semiconductor assembly 100 in this example includes a semiconductor chip 10, a metallic wiring plate 60, and a laminated substrate 70.

The cooling portion 110 discharges heat generated by the semiconductor chip 10 to the outside. The cooling portion 110 is formed of a material having a high heat conductivity rate such as aluminum. A plurality of fins may be formed in the cooling portion 110 to enlarge a heat discharge area. The semiconductor assembly 100 in this example is thermally and mechanically fixed to the cooling portion 110 by the soldering portion 112. For example, the soldering portion 112 is Sn—Sb based or Sn—Sb—Ag based solder.

The case 120 is disposed to surround the semiconductor assembly 100 on an upper surface of the cooling portion 110. A shape of the case 120 in this example is rectangular but is not limited to this. For example, a material of the case 120 is an insulation material such as resin. The resin may be selected from polyphenylene sulfide (PPS), polybutylene terephthalate (PBT), polybutyl acrylate (PBA), polyamide (PA), acrylonitrile butadiene styrene (ABS), liquid crystal polymer (LCP), polyether ether ketone (PEEK), polybutylene succinate (PBS), urethane, silicone, and the like.

The sealing resin 130 seals the inside of the case 120. The sealing resin 130 covers the entirety of the semiconductor assembly 100. That is, the sealing resin 130 seals the semiconductor chip 10, the metallic wiring plate 60, and the laminated substrate 70. For example, a material of the sealing resin 130 is epoxy resin.

The semiconductor chip 10 is a semiconductor chip formed of a semiconductor substrate such as a silicon substrate. In an example, the semiconductor chip 10 includes a vertical switching device such as an insulation gate type bipolar transistor (IGBT) and a power MOSFET. The semiconductor chip 10 may also include a reverse-conducting IGBT (RC-IGBT) including a free wheel diode (FWD). An upper surface electrode 30 and a lower surface electrode 33 opposite to the upper surface electrode may be formed on the semiconductor chip 10.

The laminated substrate 70 is disposed on the upper surface of the cooling portion 110. The laminated substrate 70 includes a metallic plate 71, an insulation plate 72, a circuit portion 73, and a circuit portion 74. For example, the laminated substrate 70 may be a direct copper bonding (DCB) substrate or an active metal brazing (AMB) substrate.

The insulation plate 72 is formed of an insulating material such as ceramic including alumina ($Al_2O_3$), aluminum nitride (AlN), silicon nitride ($Si_3N_4$), or the like. The metallic plate 71 is disposed on a lower surface of the insulation plate 72. The circuit portion 73 and the circuit portion 74 are disposed on an upper surface of the insulation plate 72. The metallic plate 71, the circuit portion 73, and the circuit portion 74 may be formed of a plate containing a metallic material such as copper and a copper alloy. The metallic plate 71, the circuit portion 73, and the circuit portion 74 may be fixed on a surface of the insulation plate 72 by solder, a brazing material, or the like.

The circuit portion 73 is bonded to the semiconductor chip 10 by soldering using a soldering portion 81. Accordingly, the circuit portion 73 is electrically connected to the semiconductor chip 10.

The circuit portion 74 is bonded to the metallic wiring plate 60 by soldering using a soldering portion 82. The circuit portion 74 is not bonded to the semiconductor chip 10 by soldering. It is however noted that the circuit portion 74 may also be bonded by soldering to any other semiconductor chip 10 than the semiconductor chip 10 bonded to the circuit portion 73 by soldering. The circuit portion 73 and the circuit portion 74 may include a metallic wiring, a pad, or the like formed on the upper surface of the insulation plate 72 and may also include a signal processing circuit or the like.

The soldering portion 81 fixes the semiconductor chip 10 to the circuit portion 73. The soldering portion 81 electrically and mechanically connects the semiconductor chip 10 to the circuit portion 73. The soldering portion 81 connects the pad included in the circuit portion 73 to the lower surface electrode 33 of the semiconductor chip 10. For example, a material of the soldering portion 81 is Sn—Cu based or Sn—Sb based solder.

The metallic wiring plate 60 is an electric wiring for the semiconductor chip 10 which is electrically connected to the semiconductor chip 10. The metallic wiring plate 60 in this example electrically connects the semiconductor chip 10 to the circuit portion 74. One end portion of the metallic wiring plate 60 is connected to the upper surface electrode 30 of the semiconductor chip 10, and the other end portion of the metallic wiring plate 60 is connected to an upper surface of the circuit portion 74. The metallic wiring plate 60 may be an electrically conductive connection member obtained by molding the metallic plate by press working or the like. The metallic plate may be a plate made of copper or a copper alloy. The metallic wiring plate 60 may include a plated film made of nickel or the like on the surface. A cross section (Z-X cross section) of the metallic wiring plate 60 may include a rectangular portion. A ribbon or a clip may also be used as the metallic wiring plate 60.

For example, a material of the metallic wiring plate 60 is copper, a copper alloy, aluminum, an aluminum alloy, or the like. In an example, a thickness of the metallic wiring plate 60 is 0.5 mm or longer and 1.0 mm or shorter. The metallic wiring plate 60 in this example includes a bonding portion 62, a raised portion 63, a connection portion 64, a raised portion 65, and a bonding portion 66.

The bonding portion 62 is bonded to the upper surface electrode 30 of the semiconductor chip 10 by soldering using a soldering portion 80. The soldering portion 80 bonds the semiconductor chip 10 to the metallic wiring plate 60 by soldering. Accordingly, the bonding portion 62 is fixed onto the semiconductor chip 10 and electrically connected to the semiconductor chip 10. For example, the soldering portion 80 is Sn—Cu based or Sn—Sb based solder.

The raised portion 63 is connected to the bonding portion 62. The raised portion 63 extends from the bonding portion 62 in a direction away from an upper surface of the semiconductor chip 10. That is, the raised portion 63 is a portion bent relative to the bonding portion 62 at any angle. The raised portion 63 in this example extends in a direction perpendicular to the upper surface of the semiconductor chip 10 (that is, the Z-axis direction).

The bonding portion 66 is bonded to an upper surface of the circuit portion 74 by soldering using the soldering portion 82. Accordingly, the bonding portion 66 is bonded onto the circuit portion 74 and electrically connected to the circuit portion 74. For example, the soldering portion 82 is Sn—Cu based or Sn—Sb based solder. The bonding portion 66 is connected to the raised portion 63 by the connection portion 64.

The raised portion 65 is connected to the bonding portion 66. The raised portion 65 extends from the bonding portion 66 in a direction away from the upper surface of the circuit portion 74. That is, the raised portion 65 is a portion bent relative to the bonding portion 66 at any angle. The raised portion 65 in this example extends in a direction perpendicular to the upper surface of the circuit portion 74 (that is, the Z-axis direction).

Figure 2A:
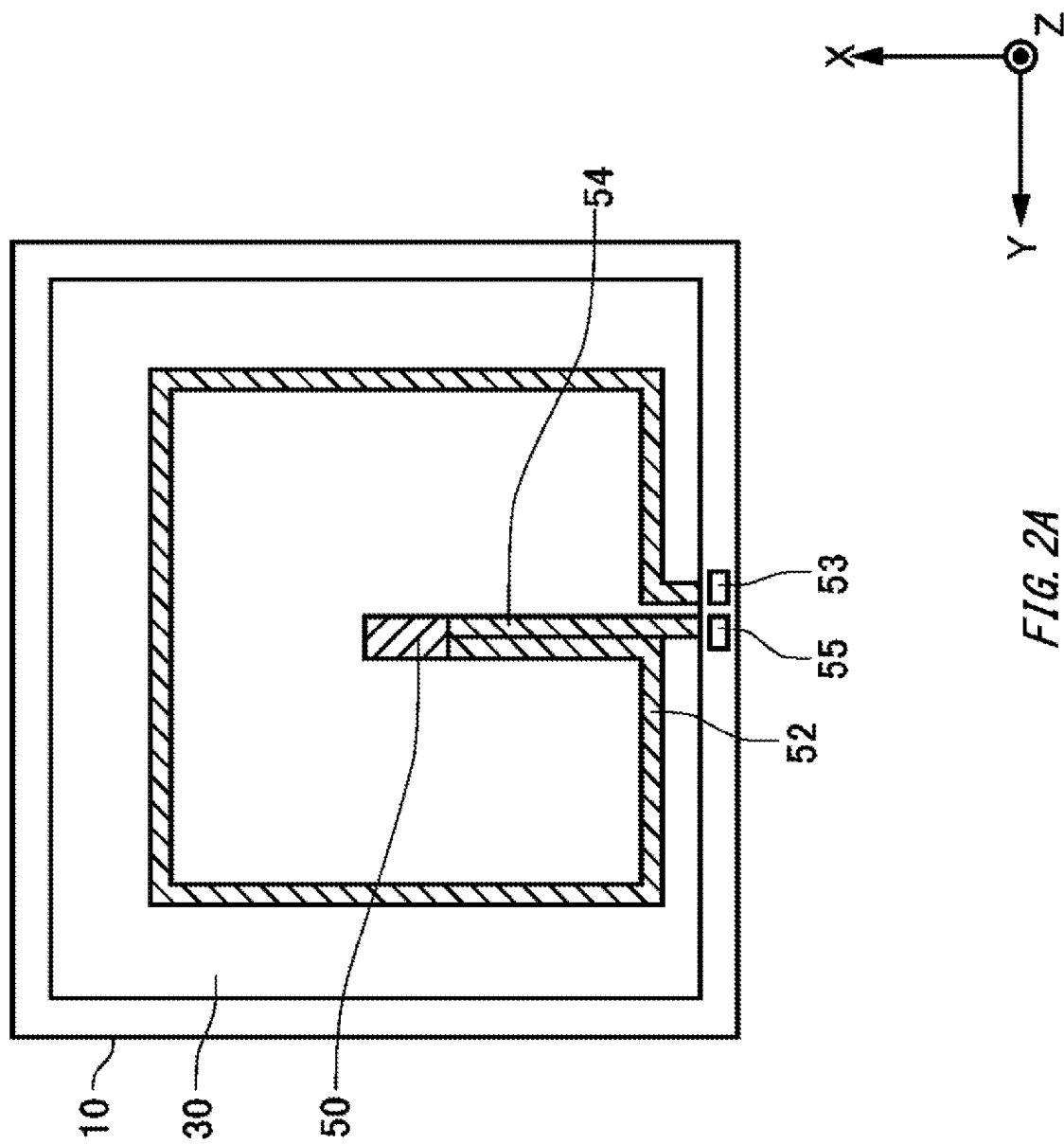
FIG. 2A illustrates an example of a top view of a semiconductor chip 10.

FIG. 2A illustrates an example of a top view of the semiconductor chip 10. The semiconductor chip 10 includes a temperature detection portion 50.

The temperature detection portion 50 is disposed on the upper surface of the semiconductor chip 10. The temperature detection portion 50 in this example is disposed in a center of the upper surface of the semiconductor chip 10. The temperature detection portion 50 may be a PN diode for temperature detection which includes an anode and a cathode. The temperature detection portion 50 is connected to an anode wire 52 and a cathode wire 54. One end of the anode wire 52 is electrically connected to the anode of the temperature detection portion 50, and one end of the cathode wire 54 is electrically connected to the cathode of the temperature detection portion 50. The other end of the anode wire 52 may be electrically connected to a power supply of a control circuit. The other end of the cathode wire 54 may be grounded.

The anode wire 52 and the cathode wire 54 are disposed to extend from the temperature detection portion 50 to an end portion of the semiconductor chip 10. The anode wire 52 and the cathode wire 54 may be respectively electrically connected to an anode pad 53 and a cathode pad 55 disposed in the end portion of the semiconductor chip 10. The anode pad 53 and the cathode pad 55 may be disposed to be adjacent to each other in the end portion of the semiconductor chip 10. The anode wire 52 is disposed so as to surround an external periphery of the temperature detection portion 50 in the top view. The anode wire 52 may also be arranged in a clockwise direction or a counterclockwise direction from the temperature detection portion 50. The anode wire 52 may also partially surround the external periphery of the temperature detection portion 50 in the top view. The anode wire 52 may start from the temperature detection portion 50 and may be arranged in a swirling manner to partially surround the bonding portion 62 in the top view. The anode wire 52 may include a plurality of corners between the temperature detection portion 50 and the anode pad 53 in the top view. The cathode wire 54 is disposed to extend from the temperature detection portion 50 to the end portion of the semiconductor chip 10 at the shortest distance. The cathode wire 54 may linearly connect the temperature detection portion 50 to the cathode pad 55 to each other in the top view. The anode wire 52 may include a portion arranged to be adjacent to and in parallel with the linearly extended cathode wire 54. The anode wire 52 may include portions which are arranged to sandwich the cathode wire 54 therebetween and face each other in the Y-axis direction on the route. Lengths of the anode wire 52 and the cathode wire 54 may be different from each other. The anode wire 52 in this example is longer than the cathode wire 54. Wiring manners for the anode wire 52 and the cathode wire 54 are not limited thereto.

The upper surface electrode 30 is disposed on the upper surface side of the semiconductor chip 10. The upper surface electrode 30 is electrically connected to the soldering portion 80. The upper surface electrode 30 may be disposed on both an inner side and an outer side of a region surrounded by the anode wire 52.

Figure 2B:
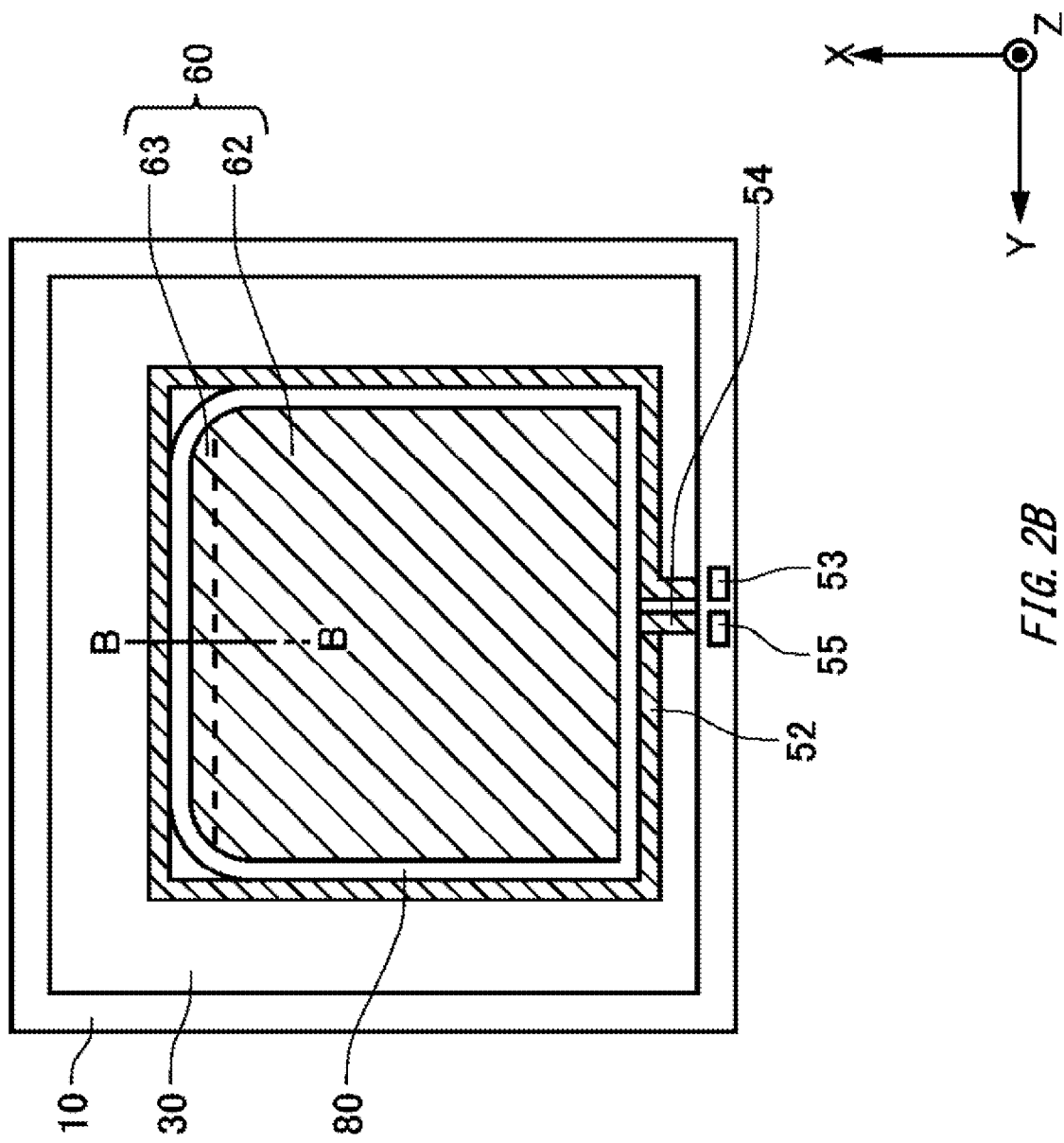
FIG. 2B is a top view of the semiconductor chip 10 at the time of solder bonding of a metallic wiring plate 60.

FIG. 2B is a top view of the semiconductor chip 10 at the time of solder bonding of the metallic wiring plate 60. The upper surface electrode 30 is bonded to the bonding portion 62 by soldering using the soldering portion 80.

The anode wire 52 is disposed to surround an external periphery of the bonding portion 62 of the metallic wiring plate 60. In the present specification, surrounding of the external periphery does not necessarily mean complete surrounding of the external periphery of the metallic wiring plate 60 by the anode wire 52, and it is sufficient when the anode wire 52 is arranged to come in contact with the soldering portion 80. Accordingly, as will be described below, the soldering portion 80 and the anode wire 52 are short-circuited before chip short circuit occurs by thermal stress of the metallic wiring plate 60, and a temperature anomaly is detected. The anode wire 52 may also be arranged along the external periphery of the bonding portion 62 of the metallic wiring plate 60 with a space therebetween.

Figure 2C:
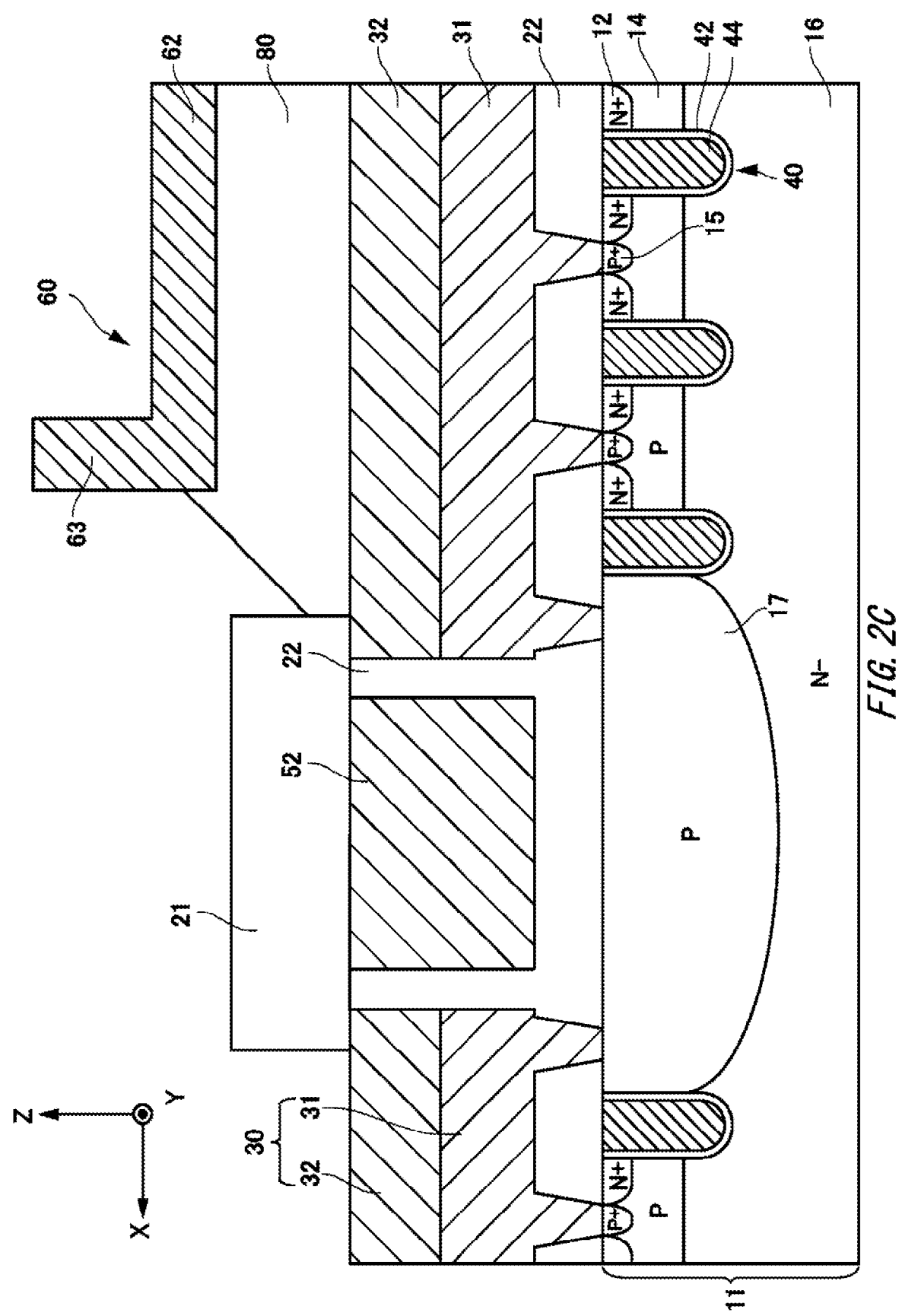
FIG. 2C illustrates a cross sectional view along B-B of a semiconductor assembly 100 illustrated in FIG. 2B.

FIG. 2C illustrates a cross sectional view along B-B of the semiconductor assembly 100 illustrated in FIG. 2B. That is, in this example, a cross section in the vicinity of the anode wire 52 is illustrated. The semiconductor chip 10 includes a semiconductor substrate 11.

The semiconductor substrate 11 is a semiconductor substrate made of silicon or the like. The semiconductor substrate may also be a wide-bandgap semiconductor made of silicon carbide or the like. An emitter region 12, a base region 14, a contact region 15, a drift region 16, a well region 17, and a gate trench portion 40 are disposed on the semiconductor substrate 11. A first insulation layer 21, a second insulation layer 22, the upper surface electrode 30, and the anode wire 52 are disposed on an upper surface of the semiconductor substrate 11.

The drift region 16 is a region of the first conductivity type which is disposed on the semiconductor substrate 11. The conductivity type of the drift region 16 in this example may be an N− type. The drift region 16 may be a remaining region where another doping region is not formed in the semiconductor substrate 11. That is, a doping concentration of the drift region 16 may be a doping concentration of the semiconductor substrate 11.

The emitter region 12 is a region of the first conductivity type which is disposed on a side of the upper surface of the semiconductor substrate 11. The conductivity type of the emitter region 12 may be an N+ type. The emitter region 12 is disposed to be in contact with the gate trench portion 40.

The contact region 15 is a region of the second conductivity type which is disposed on a side of the upper surface of the semiconductor substrate 11. The conductivity type of the contact region 15 may be a P+ type. The contact region 15 in this example is disposed to be in contact with the emitter region 12.

The base region 14 is a region of the second conductivity type which is disposed on the side of the upper surface of the semiconductor substrate 11. The conductivity type of the base region 14 may be the P type. The base region 14 is disposed above the drift region 16. In addition, the base region 14 is disposed below the emitter region 12 and the contact region 15.

The well region 17 is a region of the second conductivity type which is disposed on the side of the upper surface of the semiconductor substrate 11. The conductivity type of the well region 17 may be the P type. The well region 17 in this example is disposed to be in contact with the gate trench portion 40.

The gate trench portions 40 are arranged at a predetermined interval along a predetermined array direction (in this example, the X-axis direction). The gate trench portion 40 extends along an extension direction in parallel with the upper surface of the semiconductor substrate 11 and perpendicular to the array direction (in this example, the Y-axis direction). The gate trench portion 40 extends from the side of the upper surface of the semiconductor substrate 11 and penetrates through the base region 14 up to the drift region 16. The gate trench portion 40 includes a gate trench formed on the upper surface of the semiconductor chip 10, a gate insulation film 42, and a gate electrode 44.

The gate insulation film 42 is formed to cover an inner wall of the gate trench. The gate insulation film 42 may be formed by oxidizing or nitriding a semiconductor of the inner wall of the gate trench. The gate insulation film 42 insulates the gate electrode 44 from the semiconductor substrate 11. For example, the gate insulation film 42 is a $SiO_2$ film.

The gate electrode 44 is formed on an inner side with respect to the gate insulation film 42 inside the gate trench. When a predetermined voltage is applied to the gate electrode 44, channel is formed on a surface layer of a boundary surface in contact with the gate trench portion 40 in the base region 14. On and off of a current are controlled by switching the voltage applied to the gate electrode 44. For example, a material of the gate electrode 44 is a conductive material such as polysilicon.

The first insulation layer 21 blocks the soldering portion 80 and insulates the soldering portion 80 from the anode wire 52. Upper surfaces of the anode wire 52, the second insulation layer 22, and the upper surface electrode 30 constitute a same plane. The first insulation layer 21 is disposed on the same plane of the anode wire 52, the second insulation layer 22, and the upper surface electrode 30. An upper surface of the first insulation layer 21 is provided above the upper surface of the upper surface electrode 30. For example, a material of the first insulation layer 21 is a resin material such as polyimide. In addition, the material of the first insulation layer 21 may also be an insulation material such as alumina. The material of the first insulation layer 21 is preferably a material that repels the soldering portion 80 to facilitate the blocking of the soldering portion 80.

The second insulation layer 22 insulates the anode wire 52 from a device region of the semiconductor chip 10. The second insulation layer 22 is disposed on the upper surface of the semiconductor substrate 11. The second insulation layer 22 is disposed below the first insulation layer 21. The upper surface of the second insulation layer 22 is provided on the same plane as the upper surface of the upper surface electrode 30. An opening that connects the first electrode layer 31 to the upper surface of the semiconductor substrate 11 is formed in the second insulation layer 22. For example, a material of the second insulation layer 22 is an insulation film made of $SiO_2$ and boro-phosphosilicate glass (BPSG) or the like.

The upper surface electrode 30 is disposed on a side of the upper surface of the second insulation layer 22. The upper surface electrode 30 includes a first electrode layer 31 and a second electrode layer 32. The second electrode layer 32 is disposed on an upper surface of the first electrode layer 31. For example, a material of the first electrode layer 31 is AlSi or AlSiCu. A material of the second electrode layer 32 may be Ni or an alloy containing Ni. A thickness of the first electrode layer 31 may be thicker than a thickness of the second electrode layer 32.

The anode wire 52 is disposed in an outer peripheral direction of the soldering portion 80 below the soldering portion 80. The outer peripheral direction of the soldering portion 80 refers to a direction in which the soldering portion 80 extends by stress from the metallic wiring plate 60. The direction in which the soldering portion 80 extends changes depending on a structure of the metallic wiring plate 60 or the like. A distance between the anode wire 52 and the soldering portion 80 may be shorter than a distance between the semiconductor substrate 11 and the soldering portion 80. The upper surface of the anode wire 52 in this example is provided on the same plane as the upper surface of the upper surface electrode 30. For example, a material of the anode wire 52 is an electrically conductive material such as polysilicon and aluminum. The same material as or a different material from the first electrode layer 31 and the second electrode layer 32 may also be adopted.

The raised portion 63 may be disposed to be closer to the anode wire 52 than the bonding portion 62. Herein, since the raised portion 63 extends in the Z-axis direction by thermal expansion, stress is more likely to be generated in the raised portion 63 in the Z-axis direction than the bonding portion 62. For this reason, larger thermal stress is generated in the soldering portion 80 in some cases by an influence from the raised portion 63 in the vicinity of the raised portion 63. In this example, the raised portion 63 is disposed to be closer to a region for blocking the soldering portion 80 of the first insulation layer 21 than the bonding portion 62. That is, the anode wire 52 is disposed in a region where the thermal stress is likely to be generated. The raised portion 63 may be disposed to be close to a side opposite to a side where the anode pad 53 and the cathode pad 55 are arranged in the semiconductor chip 10, and in addition, may also be disposed to be close to a side perpendicular to a side where the anode pad 53 and the like are arranged.

FIG. 3A illustrates the semiconductor chip 10 at the time of the occurrence of the temperature anomaly. The thermal stress is generated in the soldering portion 80 by the heat generation of the semiconductor chip 10. The thermal stress may be generated by self-heating or outside air temperature variation based on energization of the semiconductor chip 10 in some cases. When a cycle of repeated stress caused by temperature changes is generated, a chip damage is caused. This example illustrates that the thermal stress is generated in the vicinity of the raised portion 63, but the thermal stress may also be generated in other positions in the surrounding of the bonding portion 62.

Figure 3B:
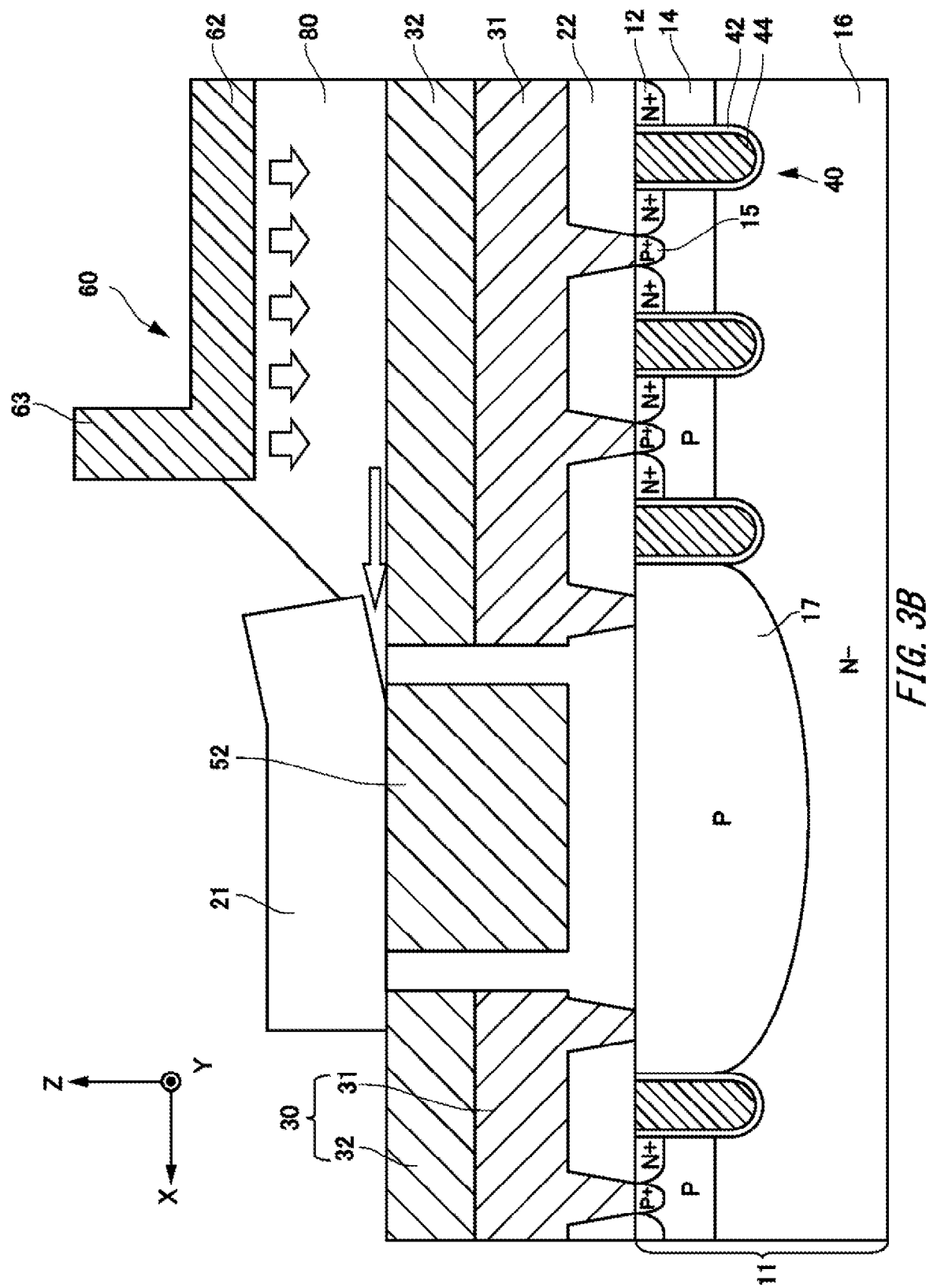
FIG. 3B illustrates a cross sectional view of the semiconductor assembly 100 at the time of the occurrence of the temperature anomaly.

FIG. 3B illustrates a cross sectional view of the semiconductor assembly 100 at the time of the occurrence of the temperature anomaly. This example illustrates the semiconductor assembly 100 in a state where the soldering portion 80 is in contact with the anode wire 52, and the temperature anomaly is generated.

The thermal expansion of the metallic wiring plate 60 occurs due to heat generated from the semiconductor chip 10. The thermal stress may be transmitted from the metallic wiring plate 60 to the soldering portion 80 in some cases since the raised portion 63 attempts to extend by the thermal expansion but is pressed against by the sealing resin. In this case, the soldering portion 80 submerges between the first insulation layer 21 and the second electrode layer 32. The soldering portion 80 comes in contact with the anode wire 52. When the soldering portion 80 comes in contact with the anode wire 52, a temperature output anomaly occurs, and a temperature detection circuit detects the temperature anomaly.

As described above, the semiconductor assembly 100 can detect the deterioration of the semiconductor module 300 by devising the arrangement of the anode wire 52. Therefore, a new component does not need to be added for failure detection. In addition, the anode wire 52 can also be integrated with the structure that blocks the soldering portion 80. The semiconductor assembly 100 detects a temperature anomaly based on anode short circuit before a chip short circuit damage occurs, and it is possible to detect the deterioration. Accordingly, a user can take measures before a significant incident occurs. In addition, an excessive life margin for safety does not need to be prepared in the design of the semiconductor assembly 100.

The chip short circuit refers to short circuit that occurs when the soldering portion 80 is electrically connected to the upper surface of the semiconductor substrate 11. When the chip short circuit occurs, there is a fear that an excess current may be generated in a system of the user.

The anode short circuit refers to short circuit that occurs when the soldering portion 80 comes in contact with the anode wire 52. In the case of the anode short circuit, a temperature anomaly occurs, but a significant failure such as the generation of the excess current in the system of the user is not caused. When the temperature anomaly is detected before the chip short circuit occurs, shifting to an operation stop state can be safely performed.

Figure 4A:
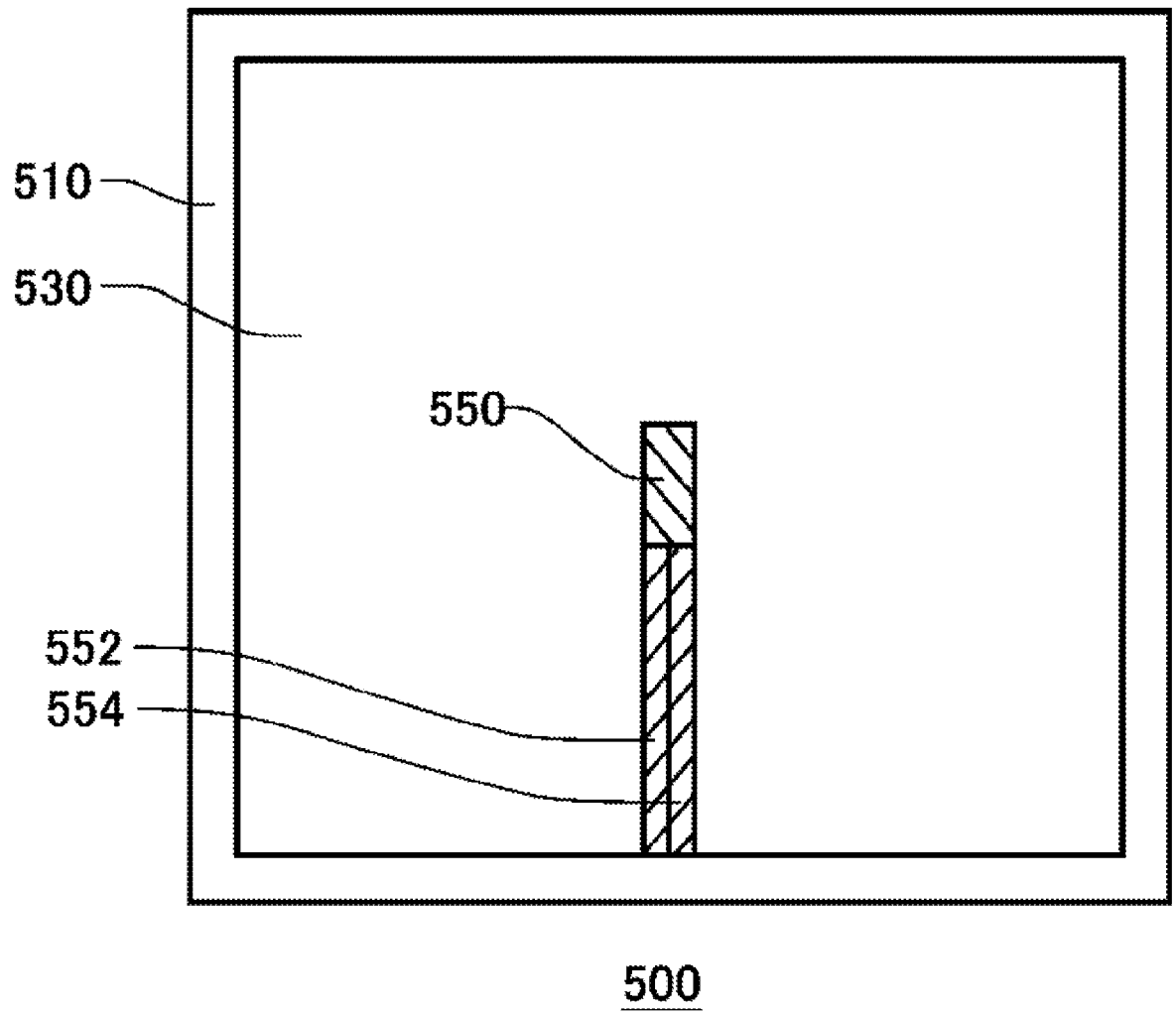
FIG. 4A illustrates a temperature detection portion 550 of a semiconductor assembly 500 according to a comparative example.

FIG. 4A illustrates a temperature detection portion 550 of a semiconductor assembly 500 according to a comparative example. The upper surface electrode 530 and the temperature detection portion 550 are disposed on an upper surface of the semiconductor chip 510. In the temperature detection portion 550, an anode wire 552 and a cathode wire 554 are connected to an end portion of the semiconductor chip 510 at a shortest distance.

FIG. 4B is an example of the semiconductor assembly 500 according to the comparative example A metallic wiring plate 560 is disposed on the semiconductor chip 510.

The metallic wiring plate 560 is bonded to the upper surface electrode 530 by soldering using a soldering portion 580. The semiconductor assembly 500 does not detect short circuit of the anode wire 552 since the anode wire 552 is not disposed in a position where the thermal stress is applied to the soldering portion 580 by thermal expansion of the metallic wiring plate 560. For this reason, the semiconductor assembly 500 does not detect an end of life on the basis of the anode short circuit before the semiconductor chip 510 is damaged by the chip short circuit.

A stress design of the semiconductor assembly 500 according to the comparative example needs to be implemented on the basis of shapes of the metallic wiring plate 560 and the soldering portion 580 to set a sufficient life design. For this reason, a sufficient life margin is needed with respect to a market demand.

Figure 5A:
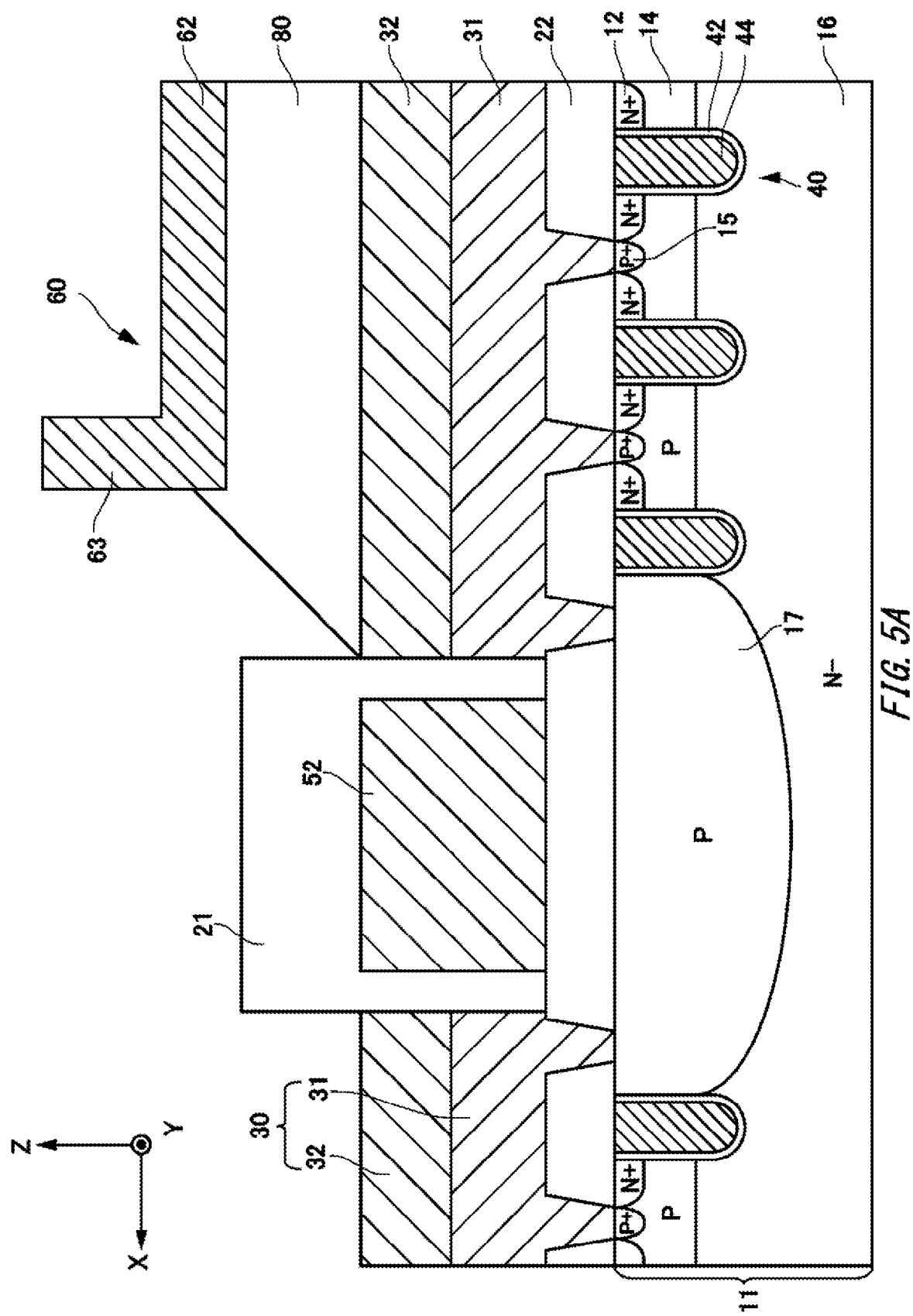
FIG. 5A illustrates a cross sectional view of the semiconductor assembly 100 according to a second embodiment.

FIG. 5A illustrates a cross sectional view of the semiconductor assembly 100 according to the second embodiment. Structures of the first insulation layer 21 and the second insulation layer 22 are different from the case of the first embodiment. In this example, a difference from the semiconductor assembly 100 according to the first embodiment will be particularly described.

The upper surface and side surfaces of the anode wire 52 are covered with the first insulation layer 21 on the upper surface of the second insulation layer 22. Thus, the anode wire 52 is insulated from the soldering portion 80 by the first insulation layer 21. The distance between the anode wire 52 and the soldering portion 80 may be shorter than the distance between the semiconductor substrate 11 and the soldering portion 80. Accordingly, it becomes easier to detect the temperature anomaly before the chip short circuit occurs.

The upper surface of the first insulation layer 21 is provided above the upper surface of the upper surface electrode 30. Accordingly, the first insulation layer 21 can block the fused soldering portion 80. The upper surface of the second insulation layer 22 is provided below the upper surface of the upper surface electrode 30. The first insulation layer 21, the first electrode layer 31, and the anode wire 52 are disposed on the upper surface of the second insulation layer 22.

Figure 5B:
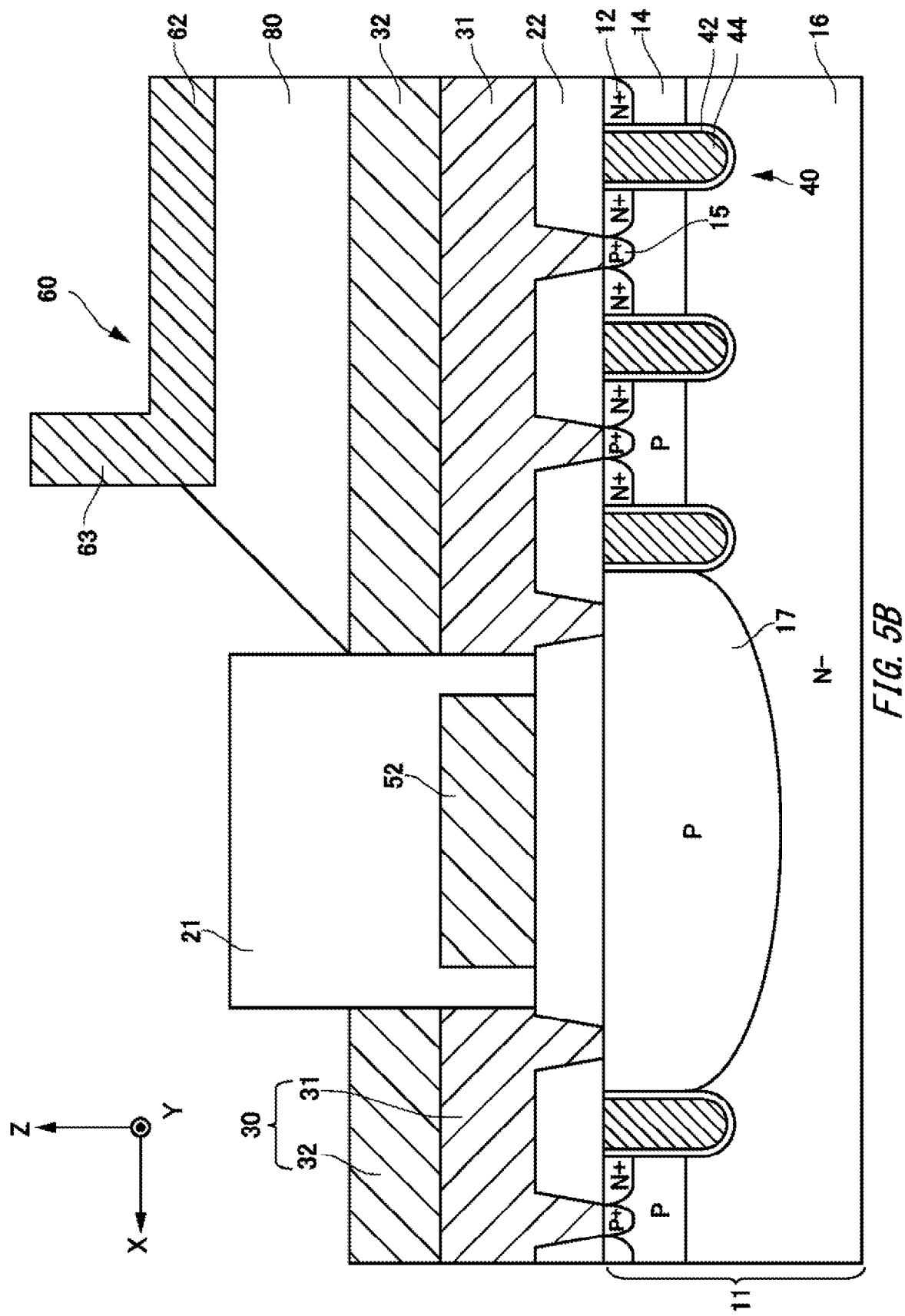
FIG. 5B illustrates a cross sectional view of the semiconductor assembly 100 according to a third embodiment.

FIG. 5B illustrates a cross sectional view of the semiconductor assembly 100 according to the third embodiment. A structure of the anode wire 52 differs from a case of the first embodiment. In this example, a difference from the semiconductor assembly 100 according to the second embodiment will be particularly described.

The anode wire 52 is disposed in a position where electric connection to the soldering portion 80 is provided before the semiconductor chip 10 is damaged by the chip short circuit. The upper surface of the anode wire 52 is provided below an upper surface of the second electrode layer 32. The upper surface of the anode wire 52 in this example is provided on the same plane as the upper surface of the first electrode layer 31, but the positional relationship is not limited thereto. It is sufficient when the anode wire 52 is disposed in a position to come in contact with the soldering portion 80 that has extended by the thermal stress.

Figure 5C:
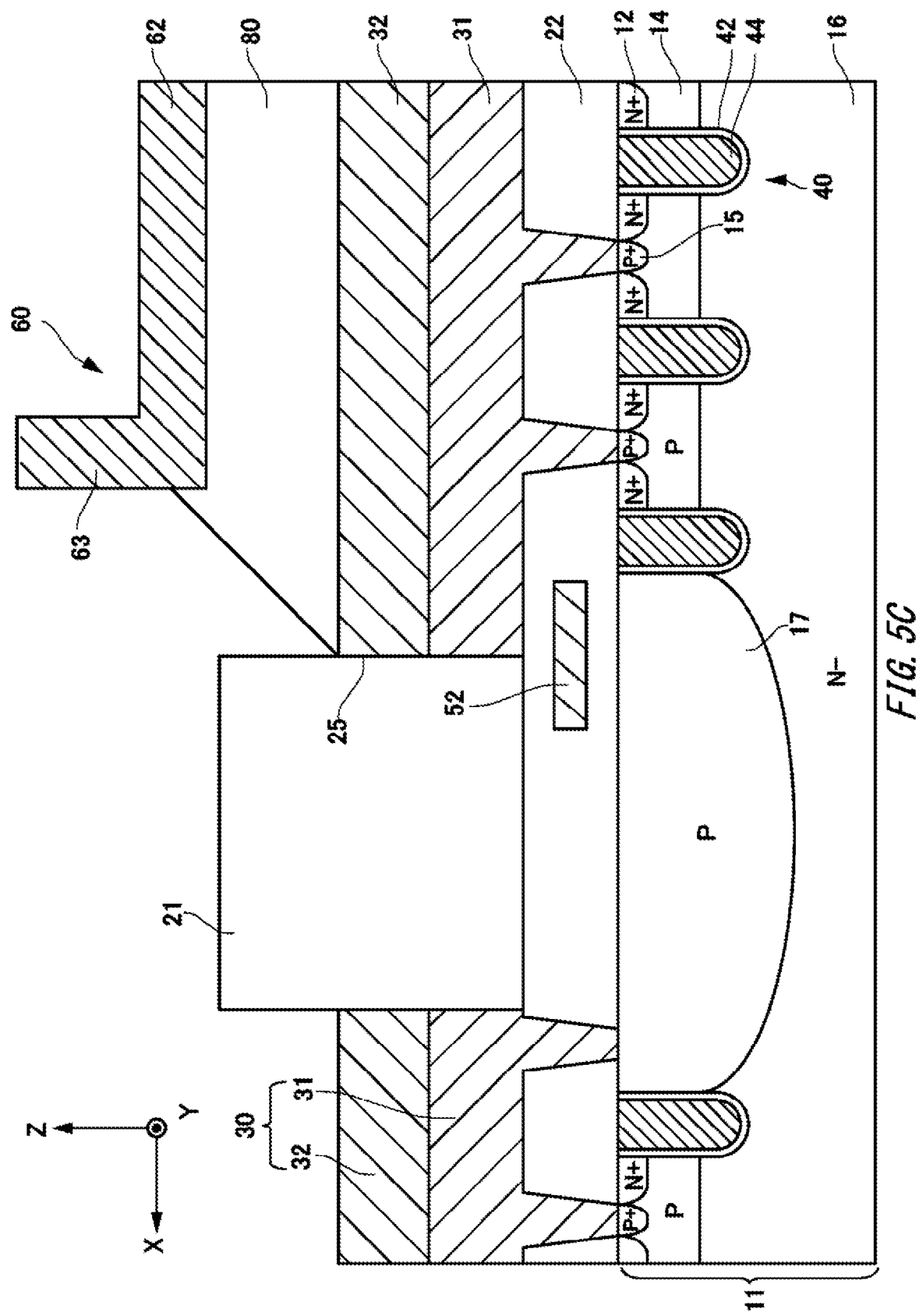
FIG. 5C illustrates a cross sectional view of the semiconductor assembly 100 according to a fourth embodiment.

FIG. 5C illustrates a cross sectional view of the semiconductor assembly 100 according to the fourth embodiment. In this example, a difference from the semiconductor assembly 100 according to the second embodiment and the third embodiment will be particularly described.

The anode wire 52 is disposed below a position where the first insulation layer 21 blocks the soldering portion 80. The anode wire 52 is disposed above the well region 17. The anode wire 52 is disposed to have its surrounding covered with the second insulation layer 22 below the first electrode layer 31 and the second electrode layer 32. The anode wire 52 is disposed in a center in the thickness direction of the second insulation layer 22 (that is, the Z-axis direction).

The anode wire 52 is disposed in mid-course on the route for the soldering portion 80 to move towards the semiconductor substrate 11. The anode wire 52 in this example is disposed below a boundary 25 between the first insulation layer 21 and the upper surface electrode 30. Accordingly, even in a case where the soldering portion 80 submerged under the boundary 25 between the first insulation layer 21 and the upper surface electrode 30, the contact with the anode wire 52 can be reliably provided. A width of the anode wire 52 in the X-axis direction is provided while the boundary 25 is set as a center. It should be noted however that the center of the anode wire 52 in the X-axis direction may also be shifted on a positive side or a negative side in the X-axis direction with respect to the boundary 25. It is sufficient when the anode wire 52 is disposed in a position to come to contact with the soldering portion 80 in a case where the soldering portion 80 submerges under the boundary 25 and extends.

Figure 6:
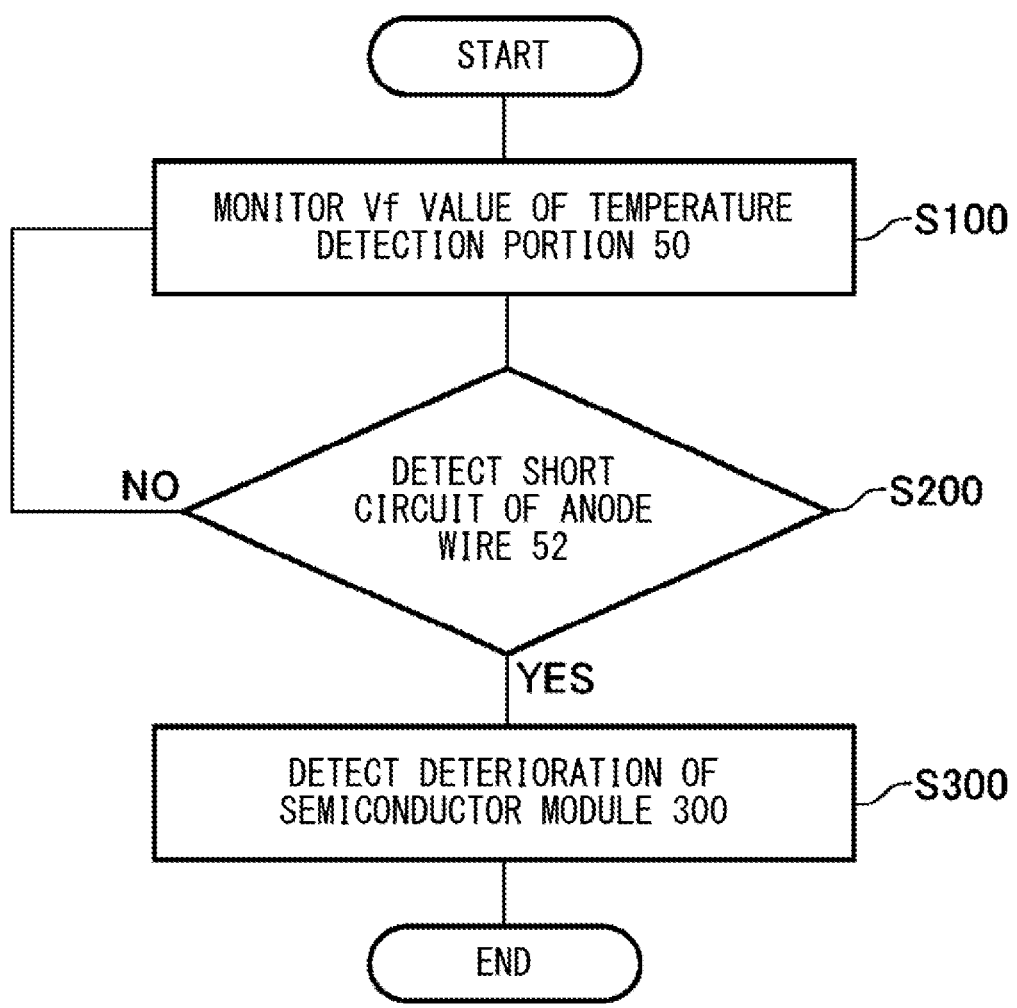
FIG. 6 illustrates an example of a flow chart of a deterioration detection method for the semiconductor module 300.

FIG. 6 illustrates an example of a flowchart of a deterioration detection method for the semiconductor module 300. As a result of step S100 to step S300, the deterioration of the semiconductor module 300 can be detected. In step S100, a Vf value of the temperature detection portion 50 placed on the semiconductor chip 10 is monitored. The Vf value is a forward voltage of a diode for temperature detection which is included in the temperature detection portion 50. When the Vf value is found, it is possible to perform conversion into a temperature of the temperature detection portion 50.

In step S200, in a case where the temperature anomaly of the temperature detection portion 50 is detected, the process proceeds to step S300. On the other hand, in step S200, in a case where the temperature anomaly of the temperature detection portion 50 is not detected, the monitoring of the Vf value of the temperature detection portion 50 continues in step S100. In step S300, the deterioration of the semiconductor module 300 is detected in accordance with the detection of the temperature anomaly. Accordingly, the end of the life of the semiconductor module 300 can be recognized. In step S300, it may be determined whether or not the temperature anomaly in step S200 is based on short circuit of the anode wire 52. According to the semiconductor module 300 in this example, it is possible to take measures such as suspension of use of the semiconductor module 300 before the damage of the chip short circuit is caused.

Figure 7A:
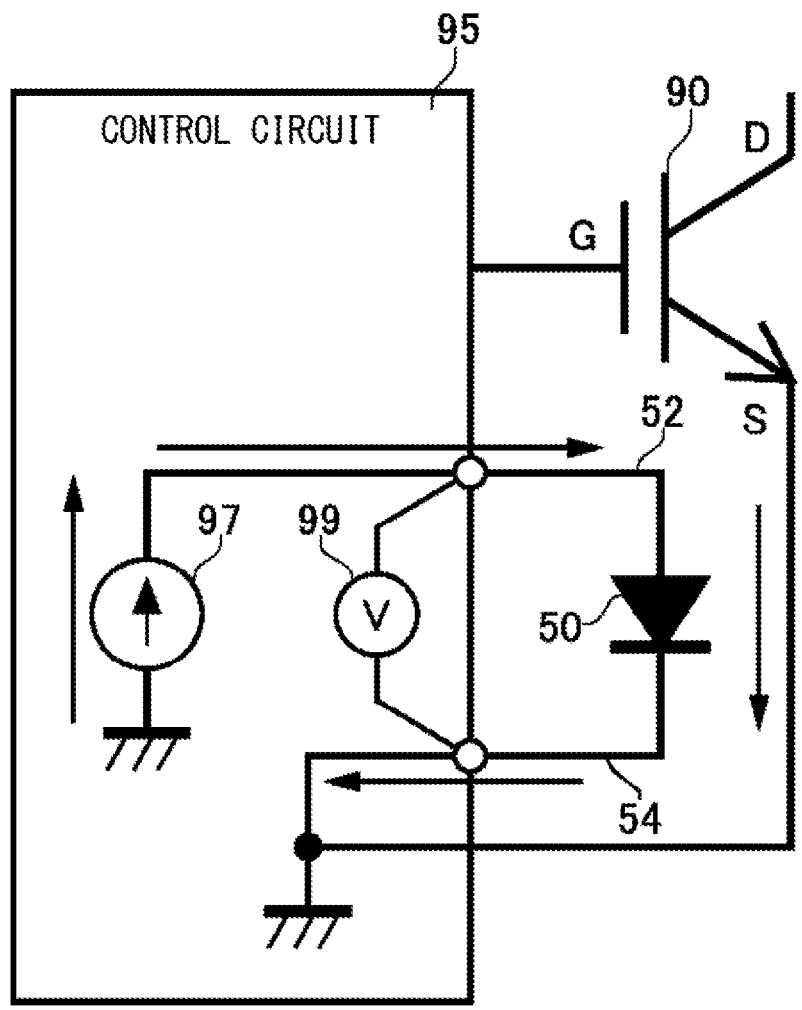
FIG. 7A illustrates a control circuit 95 for temperature detection at the time of a normal operation.

FIG. 7A illustrates a control circuit 95 for temperature detection at the time of a normal operation. The control circuit 95 detects a temperature of the semiconductor module 300. The control circuit 95 controls drive of a gate of a transistor portion 90. In addition, the control circuit 95 detects the temperature of the temperature detection portion 50. The control circuit 95 includes a power supply 97 and a voltmeter 99. It is noted that the control circuit 95 may also be disposed outside the semiconductor module 300.

The power supply 97 supplies a constant current to the temperature detection portion 50 at the time of the normal operation. The voltmeter 99 is connected to the anode wire 52 and the cathode wire 54. The voltmeter 99 detects the Vf value between the anode wire 52 and the cathode wire 54 at the time of the normal operation. Accordingly, the control circuit 95 can monitor temperature information of the temperature detection portion 50.

Figure 7B:
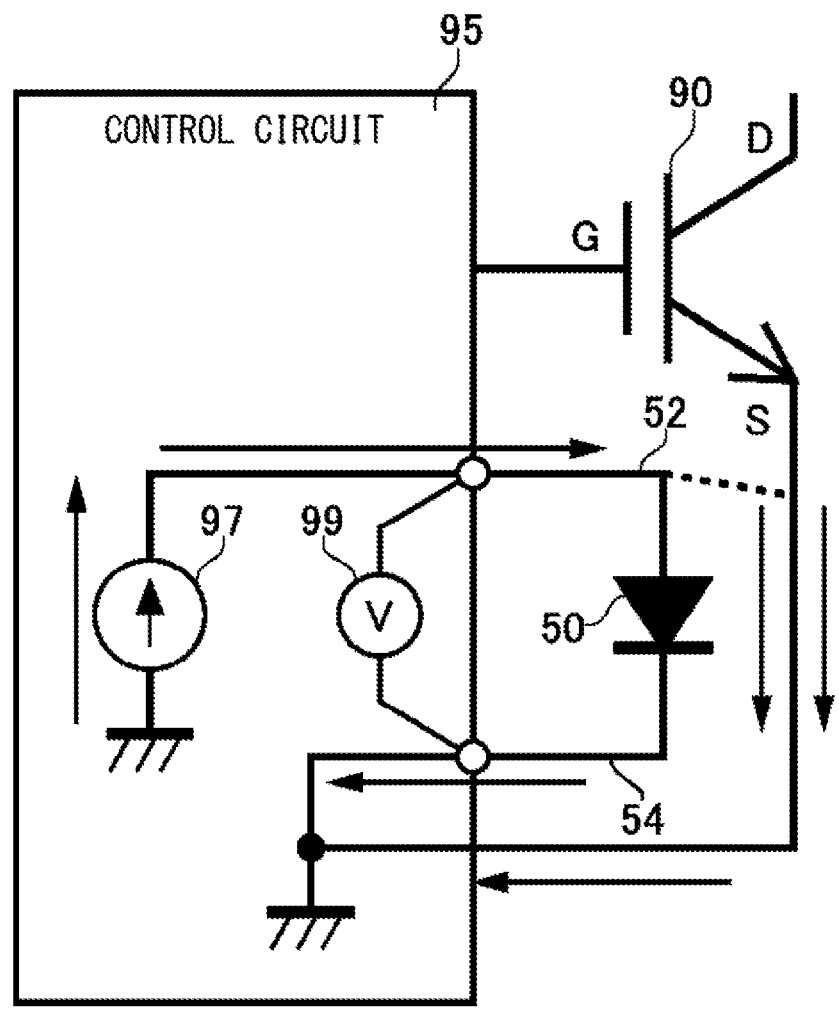
FIG. 7B illustrates the control circuit 95 for temperature detection at the time of the occurrence of the temperature anomaly.

FIG. 7B illustrates the control circuit 95 for temperature detection at the time of the occurrence of temperature anomaly. The control circuit 95 detects the temperature anomaly of the temperature detection portion 50. In this example, the anode wire 52 is electrically connected to the wire of an emitter of the transistor portion 90, and the constant current does not flow into the diode of the temperature detection portion 50. It is possible to determine that the end of the life has arrived when the temperature anomaly is based on the short circuit of the anode wire 52.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

EXPLANATION OF REFERENCES

10 . . . semiconductor chip, 11 . . . semiconductor substrate, 12 . . . emitter region, 14 . . . base region, 15 . . . contact region, 16 . . . drift region, 17 . . . well region, 21 . . . first insulation layer, 22 . . . second insulation layer, 25 . . . boundary, 30 . . . upper surface electrode, 31 . . . first electrode layer, 32 . . . second electrode layer, 33 . . . lower surface electrode, 40 . . . gate trench portion, 42 . . . gate insulation film, 44 . . . gate electrode, 50 . . . temperature detection portion, 52 . . . anode wire, 53 . . . anode pad, 54 . . . cathode wire, 55 . . . cathode pad, 60 . . . metallic wiring plate, 62 . . . bonding portion, 63 . . . raised portion, 64 . . . connection portion, 65 . . . raised portion, 66 . . . bonding portion, 70 . . . laminated substrate, 71 . . . metallic plate, 72 . . . insulation plate, 73 . . . circuit portion, 74 . . . circuit portion, 80 . . . soldering portion, 81 . . . soldering portion, 82 . . . soldering portion, 90 . . . transistor portion, 95 . . . control circuit, 97 . . . power supply, 99 . . . voltmeter, 100 . . . semiconductor assembly, 110 . . . cooling portion, 112 . . . soldering portion, 120 . . . case, 130 . . . sealing resin, 300 . . . semiconductor module, 500 . . . semiconductor assembly, 510 . . . semiconductor chip, 530 . . . upper surface electrode, 550 . . . temperature detection unit, 560 . . . metallic wiring plate, 552 . . . anode wire, 554 . . . cathode wire, 580 . . . soldering portion

What is claimed is:

1. A semiconductor assembly comprising:
a semiconductor chip including an upper surface electrode and a lower surface electrode opposite to the upper surface electrode;
a metallic wiring plate electrically connected to the semiconductor chip; and
a soldering portion that bonds the upper surface electrode of the semiconductor chip to the metallic wiring plate by soldering,
the semiconductor chip including:
a temperature detection portion;
an anode wire for the temperature detection portion;
a first insulation layer that blocks the soldering portion and insulates the soldering portion from the anode wire;
a second insulation layer that is disposed on an upper surface of the semiconductor substrate and provides insulation between the anode wire and the semiconductor substrate;
the upper surface electrode is disposed on an upper surface of the second insulation layer, and
an upper surface of the anode wire and an upper surface of the second insulation layer are provided on a same plane as an upper surface of the upper surface electrode.

2. The semiconductor assembly according to claim 1, wherein:
the semiconductor chip further includes:
a semiconductor substrate.

3. The semiconductor assembly according to claim 2, wherein:
the first insulation layer is disposed on the same plane of the anode wire, the second insulation layer, and the upper surface electrode.

4. The semiconductor assembly according to claim 2, wherein:
the anode wire is disposed in a manner that an upper surface and side surfaces of the anode wire are covered with the first insulation layer on the upper surface of the second insulation layer; and
an upper surface of the first insulation layer is provided above an upper surface of the upper surface electrode.

5. The semiconductor assembly according to claim 4, wherein
the upper surface of the anode wire is provided on a same plane as the upper surface of the upper surface electrode.

6. The semiconductor assembly according to claim 4, wherein
the upper surface of the anode wire is provided below the upper surface of the upper surface electrode.

7. The semiconductor assembly according to claim 2, wherein
the anode wire is disposed in a manner that a surrounding of the anode wire is covered with the second insulation layer below a boundary between the first insulation layer and the upper surface electrode.

8. The semiconductor assembly according to claim 2, wherein
a distance between the anode wire and the soldering portion is shorter than a distance between the semiconductor substrate and the soldering portion.

9. The semiconductor assembly according to claim 1, wherein the anode wire is disposed to surround an external periphery of the metallic wiring plate.

10. The semiconductor assembly according to claim 1, wherein:
the metallic wiring plate includes:
a bonding portion that provides bonding to the semiconductor chip, and
a raised portion that is connected to the bonding portion and extends in a direction away from the semiconductor chip; and
the raised portion is disposed to be closer to a region for blocking the soldering portion of the first insulation layer than the bonding portion.

11. A semiconductor module comprising the semiconductor assembly according to claim 1.

12. A semiconductor assembly comprising:
a semiconductor chip including an upper surface electrode and a lower surface electrode opposite to the upper surface electrode;
a metallic wiring plate electrically connected to the semiconductor chip; and
a soldering portion that bonds the upper surface electrode of the semiconductor chip to the metallic wiring plate by soldering,
the semiconductor chip including:
a temperature detection portion;
an anode wire for the temperature detection portion, surrounding an external periphery of the metallic wiring plate; and
a first insulation layer that blocks the soldering portion and insulates the soldering portion from the anode wire.

13. The semiconductor assembly according to claim 12, wherein:
the semiconductor chip further includes:
a semiconductor substrate; and
a second insulation layer that is disposed on an upper surface of the semiconductor substrate and provides insulation between the anode wire and the semiconductor substrate; and
the upper surface electrode is disposed on an upper surface of the second insulation layer.

14. The semiconductor assembly according to claim 13, wherein:
an upper surface of the anode wire and the upper surface of the second insulation layer are provided on a same plane as an upper surface of the upper surface electrode; and
the first insulation layer is disposed on the same plane of the anode wire, the second insulation layer, and the upper surface electrode.

15. The semiconductor assembly according to claim 13, wherein:
the anode wire is disposed in a manner that an upper surface and side surfaces of the anode wire are covered with the first insulation layer on the upper surface of the second insulation layer; and
an upper surface of the first insulation layer is provided above an upper surface of the upper surface electrode.

16. The semiconductor assembly according to claim 15, wherein
the upper surface of the anode wire is provided on a same plane as the upper surface of the upper surface electrode.

17. The semiconductor assembly according to claim 15, wherein
the upper surface of the anode wire is provided below the upper surface of the upper surface electrode.

18. The semiconductor assembly according to claim 13, wherein the anode wire is disposed in a manner that a surrounding of the anode wire is covered with the second insulation layer below a boundary between the first insulation layer and the upper surface electrode.

19. The semiconductor assembly according to claim 13, wherein a distance between the anode wire and the soldering portion is shorter than a distance between the semiconductor substrate and the soldering portion.

20. The semiconductor assembly according to claim 12, wherein:

the metallic wiring plate includes:

a bonding portion that provides bonding to the semiconductor chip, and a raised portion that is connected to the bonding portion and extends in a direction away from the semiconductor chip; and the raised portion is disposed to be closer to a region for blocking the soldering portion of the first insulation layer than the bonding portion.

21. A semiconductor module comprising the semiconductor assembly according to claim 12.

* * * * *